United States Patent [19]

Caturegli et al.

[11] Patent Number: 5,065,109

[45] Date of Patent: Nov. 12, 1991

[54] ELECTROPNEUMATIC BAND SELECTOR

[75] Inventors: Timothy A. Caturegli, Fremont; Robert A. Fickett, San Jose, both of Calif.

[73] Assignee: Varian Associates, Inc., Palo Alto, Calif.

[21] Appl. No.: 598,294

[22] Filed: Oct. 16, 1990

[51] Int. Cl.[5] .............................................. H03F 3/56

[52] U.S. Cl. .................................... 330/45; 315/5.47; 331/83

[58] Field of Search .................... 315/5.41, 5.46, 5.47, 315/5.53; 330/44, 45; 331/83; 358/184

[56] References Cited

U.S. PATENT DOCUMENTS

| | | | |
|---|---|---|---|
| 4,216,409 | 8/1980 | Sato et al. | 330/45 X |
| 4,546,325 | 10/1985 | Thiem et al. | 330/45 |
| 4,661,784 | 4/1987 | Kelley et al. | 331/83 |
| 4,908,549 | 3/1990 | Bres et al. | 330/45 X |

*Primary Examiner*—Steven Mottola
*Attorney, Agent, or Firm*—Peter J. Sgarbossa

[57] ABSTRACT

A band selector for a klystron includes a cam carrier and a plurality of cam followers. The cam carrier includes a plurality of cams with the cams being arranged in a plurality of rows. Each of the cam followers has a first end adapted to be mounted to a respective one of the plungers in the klystron and a second end. The cam carrier is positionable so that a selected one of the rows aligns with the cam followers. The cam followers are normally biased so that the second end of the cam followers abuts a respective one of the cams. The band selector further includes a first member movable between a first position and a second position. When the first member is in the first position, it is non-interactive with the cam followers. When the first member is moved to its second position, it becomes engageable with the first end of each of the cam followers to remove the second end of the cam followers from abutment with the respective one of the cams. Thus, the first member when moved to the second position allows the cam carrier to be repositioned so that another row of cams may be utilized for a different band. Finally, the band selector of the present invention includes a pneumatic actuator engageable with the first member to move the first member from the first position to the second position. When the pneumatic actuator is disengaged from the first member, the cam followers under their biasing return the first member to the first position.

11 Claims, 3 Drawing Sheets

ELECTROPNEUMATIC BAND SELECTOR

FIELD OF THE INVENTION

The present invention relates generally to klystrons and, more particularly, to an electropneumatically-driven external band selector which is useful to precisely position the inductive shorting plungers within the resonant cavities within the klystron.

BACKGROUND OF THE INVENTION

Tuning of the resonant cavities within a klystron is accomplished by adjusting the inductive shorting bars which are located within the resonant cavities. The adjustment of the shorting bar within each resonant cavity determines its resonant frequency. The pass band frequency of the klystron is then determined by the resonant frequency of the series of resonant cavities. The resonant cavities are within a vacuum environment within the klystron. The shorting bars are attached to plungers which enter the resonant cavities through hermetic bellows. Thus, by pushing or pulling on the plungers, the position of the shorting bar attached thereto will change within the resonant cavity.

An external klystron band selector is a device which tunes the klystron to a preselected frequency band or frequency channel by precisely positioning the plungers, which in turn precisely position the inductive shorting bars. The band selector allows for repeatedly tuning the klystron to preselected frequency channels within a band of frequencies. An example of a prior art is shown in Thiem, et al., U.S. Pat. No. 4,546,325, issued Oct. 8, 1985 ("the Thiem patent"), which has been assigned to the assignee of the present invention.

The Thiem patent discloses an electromechanical device that is driven by two solenoids. One is a linear acting solenoid, and the other is a limited rotation stepper solenoid. Power is applied to the solenoids only while changing channels. A cylinder or barrel is fitted with set screws which function as cams. The cams are set in rows parallel to the axes of the cylinder. Each of the cams is associated with a respective one of the above-mentioned plungers. Several rows of cams are spaced around the cylinder. Each row is adjusted for a different channel by adjusting the extension of each of the cams in that row.

In the operation of the device disclosed in the Thiem patent, the linear solenoid is first activated to move all the plungers away from the cams. Next, the stepper solenoid is then used to rotate the cylinder so that the desired row of cams is positioned over the plungers. Subsequently thereto, the linear solenoid releases the plungers to rest on the cams. Stops may be provided on the tuner to prevent damaging the plunger if the cam associated therewith is not adjusted properly.

As disclosed in the Thiem patent, the changing of the channels of the klystron may be accomplished relatively rapidly. For example, for a six channel band selector, any new channel is selectable within two seconds. A new channel, tuned by selecting an adjacent row of cams from the present row, may be selected in less than one second.

The prior art device disclosed in the Thiem patent has several disadvantages and limitations. For example, the disclosed device is useful with only certain types of klystrons, these being of a type which have low friction between the plungers and the walls of the cavity. The force vs. stroke characteristics of electric solenoids are usually not sufficient to overcome the spring forces and cavity friction present in many klystrons. Also, the disclosed prior art device has no means for manually tuning the klystron in the case of a power failure to the band selector. Finally, the disclosed prior art device has no means for insuring that the plungers are disengaged from the cams before the cylinder is rotated to a new position.

SUMMARY OF THE INVENTION

It is therefore an object of the present invention to overcome one or more disadvantages and limitations of the prior art enumerated hereinabove.

Another object of the present invention is to provide a tuner for a klystron which can be utilized in various types of klystrons independent of the spring forces and friction and plungers in the cavity walls.

A further object of the present invention is to provide a tuner for a klystron which can be manually tuned in the case of a power failure to the band selector.

According to the present invention, a band selector for a klystron includes a cam carrier and a plurality of cam followers. The cam carrier includes a plurality of cams with the cams being arranged in a plurality of rows. Each of the cam followers has a first end adapted to be mounted to a respective one of the plungers in the klystron and a second end. The cam carrier is positionable so that a selected one of the rows aligns with the cam followers. The cam followers are normally biased so that the second end of the cam followers abuts a respective one of the cams. The band selector further includes a first member movable between a first position and a second position. When the first member is in the first position, it is non-interactive with the cam followers. When the first member is moved to its second position, it becomes engageable with the first end of each of the cam followers to remove the second end of the cam followers from abutment with the respective one of the cams. Thus, the first member when moved to the second position allows the cam carrier to be repositioned so that another row of cams may be utilized for a different band. Finally, the band selector of the present invention includes a pneumatic actuator engageable with the first member to move the first member from the first position to the second position. When the pneumatic actuator is disengaged from the first member, the cam followers under their biasing return the first member to the first position.

An advantage of the present invention over the prior art is that because of the use of the pneumatic actuator, there is sufficient force to work with all types of klystrons using inductive shorting bars. In a further aspect of the present invention, hall effect sensors are used to determine the position of the cam carrier and the first member. An advantage of the use of the hall effect sensors is to provide a feedback signal to a controller to provide protection against any damage to the band selector or to the klystron. In another aspect of the present invention, it is a feature thereof to provide the pneumatic actuators a walking beam leverage system that drives the first member. Another feature of the present invention is its ability to be tuned with a loss of power and error. It is a feature of the present invention that the pneumatic actuator provides sufficient force vs. force characteristics.

These and other objects, advantages, and features of the present invention will become readily apparent to those skilled in the art from a study of following description an exemplary preferred embodiment when read in conjunction with the attached drawings and appended claims.

DESCRIPTION OF AN EXEMPLARY PREFERRED EMBODIMENT

Figure 1:
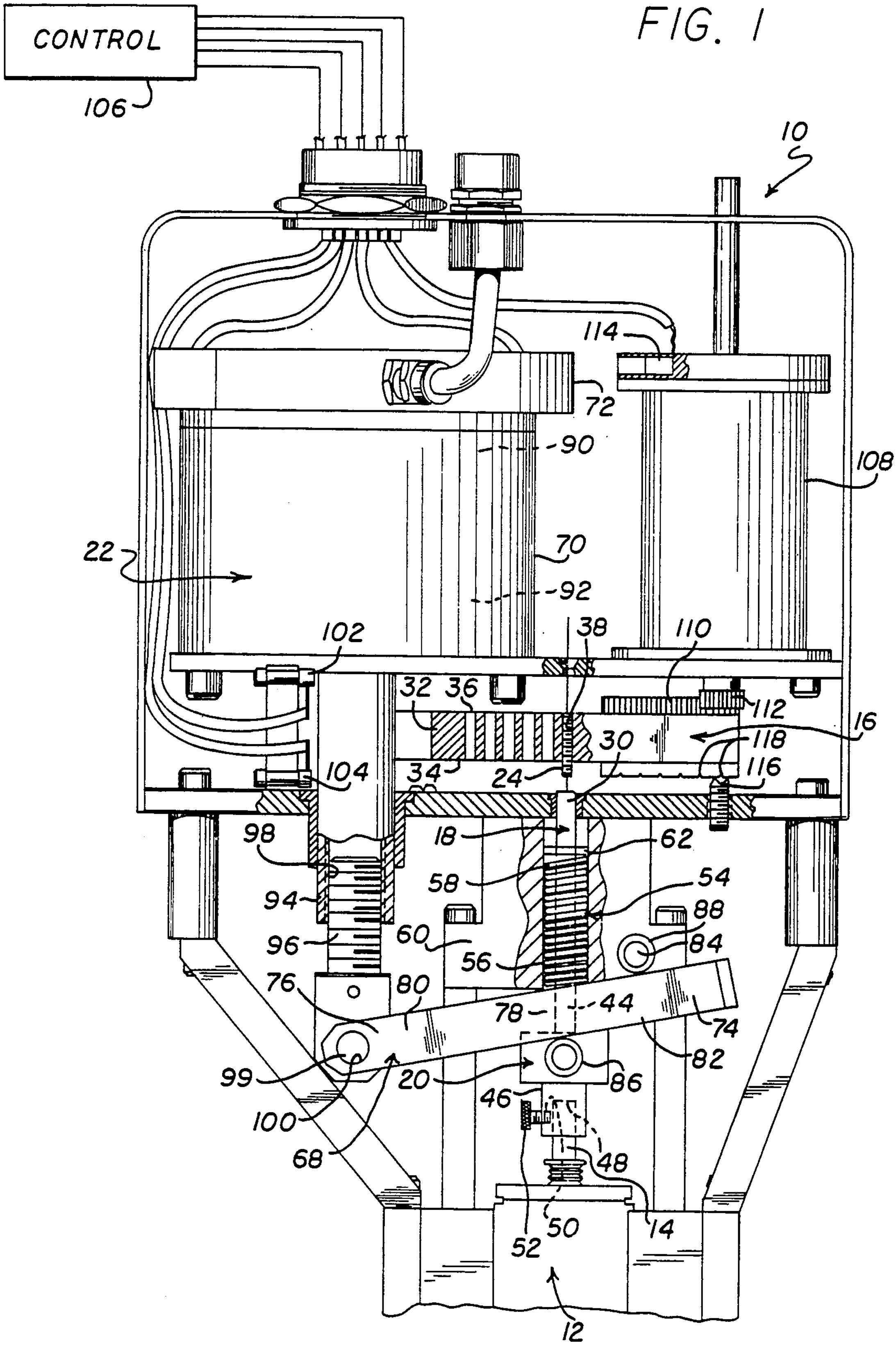
FIG. 1 is an elevational view, partially in cross-section and partially broken, illustrating an electropneumatic band selector constructed according to the principles of the present invention.
Figure 2:
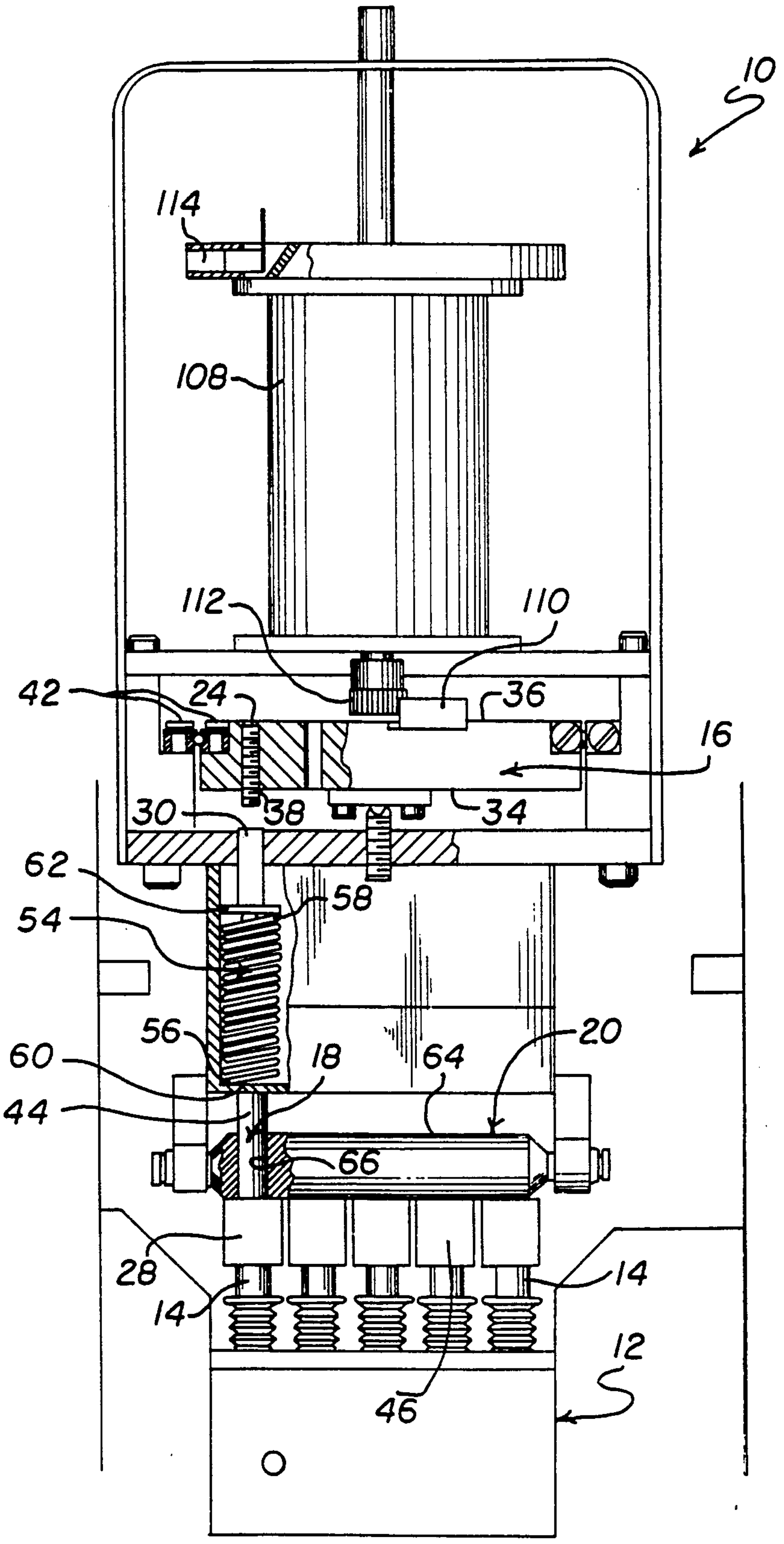
FIG. 2 is a side view, partially in cross-section and partially broken, of the electropneumatic band selector shown in FIG. 1.
Figure 3:
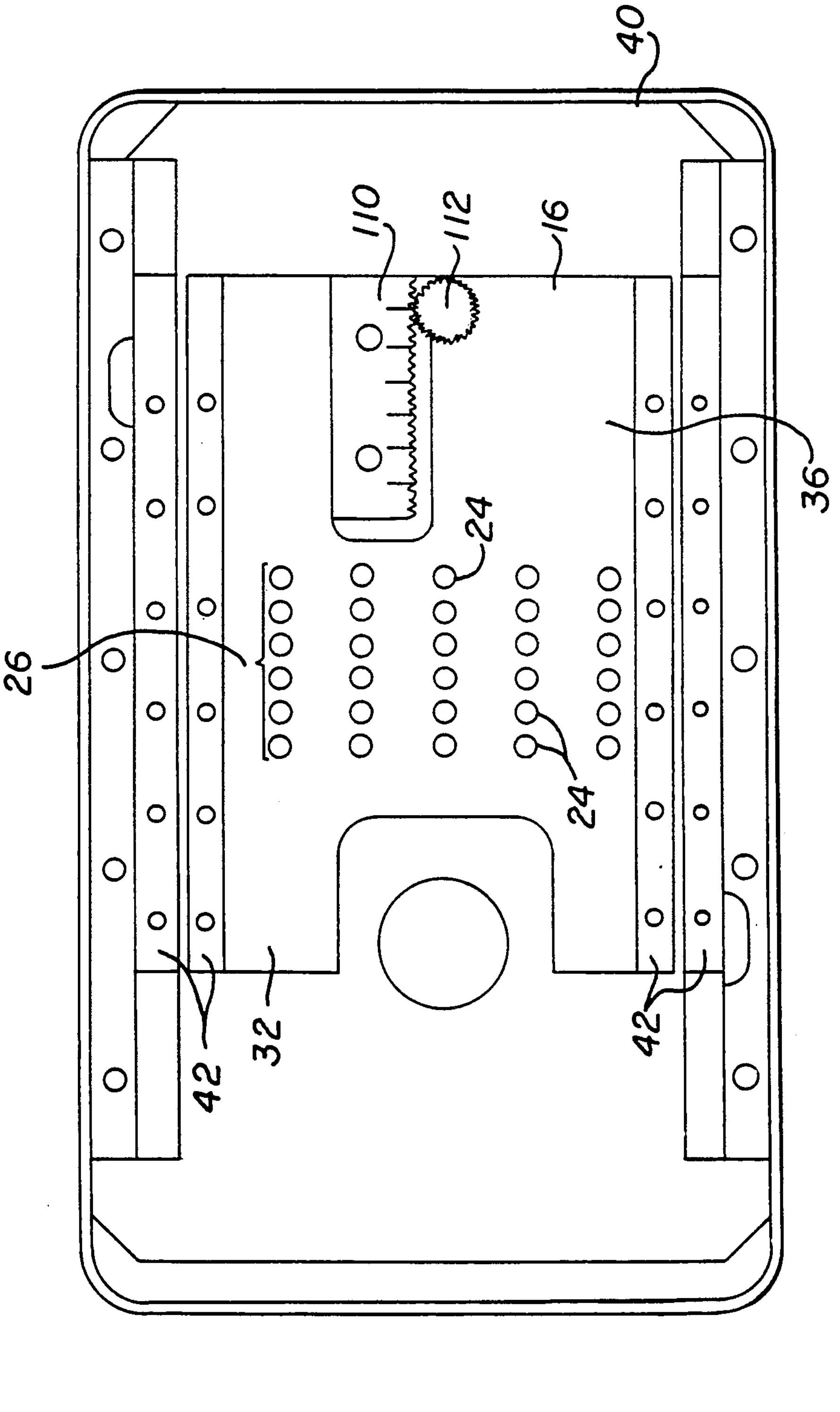
FIG. 3 is an enlarged plan view of the cam carrier used in the electropneumatic band selector.

Referring now to FIGS. 1–3, there is shown an electropneumatic band selector 10 for a klystron 12. As is well known in the art, the klystron 12 includes a plurality of plungers 14. Each of the plungers is attached to a respective one of a plurality of inductive shorting bars (not shown) disposed within a respective one of a plurality of resonant cavities (not shown) within the klystron 12. Each of the shorting bars is movable to change the resonant frequency of a respective one of the cavities. The cavities, being in series, then determine the frequency pass band or channel of the klystron 12.

The electropneumatic band selector 10 includes a cam carrier 16, a plurality of cam followers 18, a first member 20 and a pneumatic actuator 22. The cam carrier 16 includes a plurality of cams 24. The cams 24 are arranged in a plurality of rows 26, as best seen in FIG. 3. As described in greater detail hereinbelow, the cam carrier 16 is positionable so that a selected one of the rows 26 aligns with the cam followers 18.

Each of the cam followers 18 has a first end 28 and a second end 30. The first end 28 is adapted to be mounted to a respective one of the plungers 14. The cam followers 18 are normally biased so that the second end 30 abuts a respective one of the cams 24.

More particularly, the cam carrier 16 includes a cam plate 32 having a first face 34, a second face 36, and a plurality of threaded bores 38 therethrough. The cams 24, in a preferred embodiment of the present invention, are threaded tuning screws threadingly received by a respective one of the threaded bores 38. The cam plate 32 is linearly movable transverse to the rows. Accordingly, the cam plate 32 is mounted to a housing 40 by a set of crossed roller linear bearings 42 along its opposite edges.

Each of the cam followers includes an elongated cylindrical rod 44. The first end 28 of each of the cam followers 18 is an enlarged diameter portion 46 having a bore 48 coaxial with the rod 44. The bore 48 is dimensioned to receive a respective one of the plungers 14. The enlarged diameter portion 46 further has a radial threaded bore 50. The cam follower 18 further includes a threaded fastener 52 received by the threaded bore 50 to engage the plunger 14 as best seen in FIG. 1.

To bias the cam followers 18, a coil spring 54 having a first end 56 and a second end 58 is provided. The first end 56 of the spring 54 is stationarily mounted by abutting a spring housing 60, as best seen in FIG. 2. The elongated rod 44 of the cam follower 18 is coaxially received by the coil spring 54. The second end of the spring 54 is then attached to the second end 30 of a respective one of the cam followers 18 so that the spring 54 exerts a biasing force on the cam follower 18. To attach the second end 58 of the spring 54 to the cam follower 18, the elongated rod 44 includes a disc 62. The second end 58 of the spring 54 pressingly abuts the disc 62.

The first member 20 is movable between a raised first position and a lowered second position, the lowered second position being shown in FIGS. 1 and 2. When the first member 20 is in its first position, it is non-interactive with the cam followers 18. When the first member 20 is moved to its second position, it engages the first end 18 of each of the cam followers, thereby retracting the second end 30 of each of the cam followers 18 from engagement with a respective one of the cams 24. This retraction allows the cam carrier 16 to be repositioned so that a second selected one of the rows aligns with the cam followers.

More particularly, the first member 20 includes an elongated bar 64. The bar 64 has a plurality of openings 66 therethrough. Each of the openings 66 has one of the cam followers 18 received therethrough in slidable engagement. The bar 64 engages the enlarged diameter portion 46 when it is being moved to the second position. The enlarged diameter portion 46 of at least one of the cam followers 18 returns the bar 64 to its first position.

To move the first member 20, or bar 64, from the first position to the second position, the pneumatic actuator 22 engages the first member 20. When the actuator 22 is disengaged from the first member 20, the cam followers 18 and, more particularly, the enlarged diameter portion 46, return the first member to the first position.

More particularly, the pneumatic actuator 22 includes a lever 68, an air cylinder 70, and an air valve 72. The lever 68 has a first end portion 74, second end portion 76, middle portion 78 intermediate the first end portion 74 and second end portion 76, an upper edge 80 and a lower edge 82. The lower edge at the middle portion 78 of the lever 68 slidably engages the first member 20. The upper edge 80 at the first end portion 74 of the lever 68 slidably engages a fulcrum 84. The first member 20 further includes a roller 86. The lower edge 82 at the middle portion 78 of the lever 68 engages the roller 86. Furthermore, the fulcrum 84 is also a roller 88.

The air cylinder 70 has an upper first chamber 90, a lower second chamber 92, and a shaft 94. The second end portion 76 of the lever 68 is attached to the shaft 94. A coupling member 96 may be threadingly received by a threaded bore 98 within the shaft 94. The threaded coupling member 96 provides adjustment of the positioning of the lever 68. The coupling member 96 may include a pin 99 about which the second end portion 76 of the lever 68 is rotatably mounted through a bore 100. The air cylinder 70 is operable to extend the shaft 94 from the cylinder when the first chamber 90 is pressurized and to retract the shaft partially into the cylinder 70 when the second chamber 92 is pressurized. Such types of air cylinders are well known.

The air valve 72 is controllable to pressurize selectively the first chamber 90 and the second chamber 92 to retract and extend the shaft 94. A pair of hall effect sensors 102, 104, axially spaced proximate to the shaft 94, detect the retraction and extension limits. The sensors 102, 104, are electrically coupled to a controller 106. A magnetic element, not shown, is disposed on the shaft 94 between each of the sensors 102, 104, to provide proper operation thereof as is well known in the art. The upper sensor 102 detects a retraction limit of the shaft 94 and the lower sensor 104 detects an extension limit of the shaft 94. The appropriate one of the sensors 102, 104 then develops an electrical signal in response to the detection of the retraction or of the extension limit. The controller, in response to this electrical signal, then develops a further electrical signal for application to the air valve 72 to control the pressurization of the first and second chambers 90, 92 in the air cylinder 70.

When the first chamber 90 is pressurized, the shaft 94 moves the second end portion 76 of the lever 68 downward. The lever 68 then moves the first member 20 to its second position, thereby removing the cam followers 18 from abutment with the cams 24. The cam carrier 16 may then be repositioned. To position the cam carrier 16, a stepping solenoid 108 may be coupled to the cam plate 32. This stepping solenoid 108 is operative to move the cam plate 32 in discrete steps. A rack 110 and pinion 112 interconnect the solenoid 108 and the cam plate 32. The pinion 112 is rotatably driven by the solenoid 108. The rack 110 is attached to the cam plate 32 and is further driven by the pinion 112. A plurality of hall effect sensors 114 are associated with the solenoid 108. The hall effect sensors 114 develop an electrical signal indicative of the present position of the cam plate 32. The controller in response to the electrical signal may determine the present position of the cam plate and the next position of the cam plate to tune the klystron 12 to a different frequency band or channel. An advantage of a single controller is that no signal will be sent to the stepping solenoid 108 to change the position of the cam plate 32 without the controller first instructing the air valve 72 to remove the cam followers 18 from engagement with the cams 24 as described hereinabove.

When the cam plate 32 is being moved, accurate alignment of the cams 24 with the cam followers 18 is accomplished by spring biased detent ball 116 and detents 118 mounted to the cam plate 32. The detents 118 are spaced commensurately with the spacing between the rows 26 of the cams 24. Each of the detents 118 provides an accurate alignment for an associated one of the rows 26 upon repositioning of the cam plate 32. When the cam plate 32 is so positioned, the controller then instructs the air valve 72 to pressurize the lower chamber 92 of the air cylinder 70 to retract the lever 68, thereby allowing the spring biased cam followers 18 to engage the new set of cams 24.

There has been described hereinabove a novel, electropneumatic band selector for a klystron. It is obvious that those skilled in the art may now make numerous uses of and departures from the present invention without departing from the inventive concepts disclosed herein. Accordingly, the present invention is to be defined solely by the scope of the following claims.

We claim:

1. For a klystron having a plurality of plungers attached to a respective one of a plurality of inductive shorting bars disposed within a respective one of a plurality of resonant cavities in said klystron, wherein each of said shorting bars is movable to change resonant frequency of said respective one of said cavities, an electropneumatic band selector comprising:

a cam carrier including a plurality of cams, said cams being arranged in a plurality of rows;

a plurality of cam followers, each of said cam followers having a first end adapted to be mounted to a respective one of said plungers and a second end, said cam carrier being positionable so that a selected one of said rows aligns with said cam followers, said cam followers being normally biased so that said second end abuts a respective one of said cam;

a first member movable between a first position and a second position, said first member when in said first position being non-interactive with said cam followers and when moved to said second position being engageable with said first end of each of said cam followers to remove said second end of each of said cam followers from abutment with said respective one of said cams to allow said cam carrier to be repositioned so that a second selected one of said rows aligns with said cam followers;

a pneumatic actuator engageable with said first member to move said first member from said first position to said second position, said cam followers returning said first member to said first position when said actuator is disengaged from said first member.

2. An electropneumatic band selector as set forth in claim 1 wherein said cam carrier includes a cam plate having a first face, a second face, and a plurality of threaded bores therethrough, said cams being tuning screws threadingly received by a respective one of said threaded bores, said cam plate being linearly movable transverse to said rows.

3. An electropneumatic band selector as set forth in claim 2 further comprising a spring biased detent ball, said cam plate further having a plurality of detents based commensurately with a spacing between said rows, said detent ball being in slidable engagement with said detents, each of said detents providing an accurate alignment for an associated one of said rows to said cam followers upon repositioning of said cam plate.

4. An electropneumatic band selector as set forth in claim 2, further comprising a stepping solenoid coupled to said cam plate, said solenoid being operative to move said cam plate in discrete steps.

5. An electropneumatic band selector as set forth in claim 4 further comprising a rack and pinion interconnecting said solenoid and said cam plate, said pinion being driven by said solenoid, said rack being attached to said cam plate and further being driven by said pinion.

6. An electropneumatic band selector as set forth in claim 4 further comprising:

a controller; and a plurality of hall effect sensors associated with said solenoid to develop an electrical signal, said controller in response to said electrical signal determining a present position of said cam plate.

7. An electropneumatic band selector as set forth in claim 1 wherein each of said cam followers includes an elongated cylindrical rod, said first end of each of said cam followers being an enlarged diameter portion having a bore coaxial with said rod, said bore being dimensioned to receive a respective one of said plungers.

8. An electropneumatic band selector as set forth in claim 7 wherein said enlarged diameter portion further has a radial threaded bore, each of said cam followers further including a threaded fastener received by said threaded bore to engage said respective one of said plungers.

9. An electropneumatic band selector as set forth in claim 7 wherein said first member includes an elongated bar having a plurality of openings therethrough, each of said openings having a respective one of said cam followers in slidable engagement, said bar engaging said enlarged diameter portion when being moved to said second position, said enlarged diameter portion of at least one of said cam followers returning said bar to said first position.

10. An electropneumatic band selector as set forth in claim 7 wherein each of said cam followers further includes a coil spring having a first end and a second end, said rod being coaxially received by said coil spring, said first end of said spring being stationarily mounted, said second end of said spring being attached to said second end of a respective one of said cam followers so that said spring exerts a biasing force on a respective one of said cam followers.

11. An electropneumatic band selector as set forth in claim 10 wherein said rod includes a disc, said second end of said spring pressingly abutting said disc.

* * * * *